(12) United States Patent
Tanaka et al.

(10) Patent No.: US 7,812,389 B2
(45) Date of Patent: *Oct. 12, 2010

(54) PROGRAMMABLE NONVOLATILE MEMORY AND SEMICONDUCTOR INTEGRATED CIRCUIT DEVICE

(75) Inventors: Takashi Tanaka, Itami (JP); Seiichi Endo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/405,579

(22) Filed: Mar. 17, 2009

(65) Prior Publication Data

US 2009/0179249 A1    Jul. 16, 2009

Related U.S. Application Data

(63) Continuation of application No. 11/411,935, filed on Apr. 27, 2006, now Pat. No. 7,518,176.

(30) Foreign Application Priority Data

Apr. 28, 2005    (JP) ............... 2005-132461

(51) Int. Cl.
*H01L 29/78* (2006.01)
(52) U.S. Cl. ............... 257/314; 257/E29.255
(58) Field of Classification Search ......... 257/314–316, 257/E29.255
See application file for complete search history.

(56) References Cited

U.S. PATENT DOCUMENTS 6,376,879 B2    4/2002    Mori et al.

| 6,678,190 | B2 | 1/2004 | Yang et al. |
| 6,914,288 | B2* | 7/2005 | Itou et al. ............ 257/314 |
| 6,930,348 | B2* | 8/2005 | Wang ............ 257/315 |
| 6,965,143 | B2* | 11/2005 | Zheng et al. ............ 257/315 |
| 2004/0065918 | A1 | 4/2004 | Katayama et al. |

FOREIGN PATENT DOCUMENTS

| JP | 11-017156 | 1/1999 |
| JP | 2000-243926 | 9/2000 |
| JP | 2001-015617 | 1/2001 |
| JP | 2002-118177 | 4/2002 |
| JP | 2002-299475 | 10/2002 |
| JP | 2003-031701 | 1/2003 |
| JP | 2005-057111 | 3/2005 |

OTHER PUBLICATIONS

Japanese Notice of Grounds of Rejection, w/ English translation thereof, issued in Japanese Patent Application No. JP 2005-132461 dated Jun. 22, 2010.

* cited by examiner

*Primary Examiner*—Nathan W Ha
(74) *Attorney, Agent, or Firm*—McDermott Will & Emery LLP

(57) ABSTRACT

Distance $\lambda m$ between a floating gate and a drain contact of a floating gate transistor forming a memory cell is set to be greater than a distance $\lambda$ determined based on a minimum design dimension between a control gate and a contact of a peripheral transistor. Data retention characteristics of a programmable memory which stores data in accordance with the amount of accumulated charges in the floating gate can be ensured without being affecting by mask misalignment or the like.

2 Claims, 7 Drawing Sheets

THE SAME MANUFACTURING STEP
THE SAME MINIMUM DESIGN RULE EXCEPT
FOR DISTANCE BETWEEN FG AND BL CONTACT

PROGRAMMABLE NONVOLATILE MEMORY AND SEMICONDUCTOR INTEGRATED CIRCUIT DEVICE

RELATED APPLICATIONS

This application is a Continuation of U.S. application Ser. No. 11/411,935, filed Apr. 27, 2006 now U.S. Pat. No. 7,518, 176, claiming priority of Japanese Application No. 2005-132461, filed Apr. 28, 2005, the entire contents of each of which are hereby incorporated by reference.

BACKGROUND OF THE INVENTION

1. Field of the Invention

The present invention relates to a programmable nonvolatile memory and a semiconductor integrated circuit device and, more particularly, to a one-time programmable read only memory (OTPROM) and a semiconductor integrated circuit device with the memory embedded therein. More specifically, the present invention relates to a structure for improving data retention characteristics of such memory.

2. Description of the Background Art

In a data processing system, fixed data such as a boot loader program for starting an OS (operating system), voice data and font data are stored in a ROM (read only memory) in general. ROM includes a masked ROM whose storage contents are determined by mask interconnection in a manufacturing step and an OTPROM whose storage contents can be programmed only once. As compared with an ultraviolet ray erasable ROM (EPROM: electrically programmable ROM), the OTPROM differs in that no ultraviolet ray transparent window for erasing storage contents is provided and the storage contents can be neither erased nor rewritten.

OTPROM has advantages of allowing a user to program its storage contents according to an application purpose and to add a necessary function and of enabling the use of an inexpensive package because no high-cost ultraviolet ray radiation window for erasing the storage contents is required.

ROM needs to retain programmed data fixedly over a long period of time. When an element for accumulating electric charges in a floating gate or an insulation film to store data is used for the storage element of such an OTPROM, charge retention characteristics should be ensured. Among measures conventionally taken for guaranteeing reliability of such a ROM is improving a film quality of a gate insulating film under a floating gate.

Prior Art Document 1 (Japanese Patent Laying-Open No. 2001-015617) discloses a nonvolatile semiconductor memory device in which a memory cell is comprised of a memory transistor for storing data and a selecting transistor for connecting the memory transistor to a data line (bit line) according to a selection signal. The memory transistor is formed of a stacked gate type field effect transistor having a floating gate for accumulating charges according to storage information and a control gate formed in an upper layer above the floating gate. The selecting transistor is formed through the same manufacturing steps as those of the memory transistor, and has a control gate and a floating gate short circuited to function as a single gate MOS transistor (insulated gate type field effect transistor). A MOS transistor of a peripheral circuit has a gate formed in the same manufacturing step as that of the control gate.

According to Prior Art Document 1, in an integrated circuit device having a memory and a logic circuit formed on the same semiconductor substrate, a memory cell transistor and a transistor of the logic circuit are formed through the same manufacturing steps. A gate of a peripheral transistor of the logic circuit is formed at the same manufacturing step as that of a control gate of the memory cell transistor. In Prior Art Document 1, the peripheral transistor and the memory cell transistor are formed at the same manufacturing steps and for reducing a step between a peripheral circuit portion and a memory array portion, a floating gate electrode layer of the memory cell transistor is made thin. By connecting a control gate electrode layer to the floating gate electrode layer in the selecting transistor, the control electrode of the selecting transistor is made equivalently thick.

According to Prior Art Document 1, when a first level gate electrode film (floating gate) used as a control electrode is made thin for reducing a step between transistors in the memory array portion and the peripheral logic circuit portion, a failure, such as penetration of a metal interconnection contact through the gate electrode, occurs to deteriorate reliability. To avoid such failure, a floating gate is also formed for the selecting transistor at the same step as that of the memory transistor to form the selecting transistor into a two-layer gate structure to make the film equivalently thick. A conductive film formed at the same manufacturing step as that of the control gate of the memory transistor is electrically short-circuited to a first level gate electrode corresponding to the floating gate. The document 1 intends to improve reliability of a contact of the gate electrode of the selecting transistor by securing a sufficient gate electrode film thickness of the selecting transistor.

Prior Art Document 2 (Japanese Patent Laying-Open No. 11-017156) discloses a structure for eliminating a failure of a bit line contact to a memory cell in which a field insulating film is left in a region other than a drain opening, and an opening for a drain contact is formed by applying an etching with the field insulting film used as a mask. A contact region is opened in a self-alignment manner with an aspect ratio reduced, a bit line and a bit line contact are formed in a drain contact region with the Damascene process and a source region and a source contact are formed similarly through the Damascene process.

Prior Art Document 3 (U.S. Pat. No. 6,678,190) discloses a nonvolatile memory cell structure in which a MOS transistor having only a floating gate formed is used as a memory transistor, and the memory transistor is connected to a source line through a selecting transistor. The memory transistor is connected to a bit line. In programming, current is caused to flow between the bit line and the source line to generate channel hot electrons and inject the hot electrons into the floating gate to perform writing. In erasing, collective erasing is performed by ultraviolet ray irradiation. Prior Art Document 3 discloses the use of the nonvolatile memory as general EPROM and OTPROM.

ROM is required to stably retain stored data for a long period of time. Under a certain condition, however, data retention characteristics are deteriorated. The inventor(s) of the present invention found that the essential causes of this problem is that in a nonvolatile memory for storing data by the amount of accumulated charges, a margin for process variation such as a variation in the gate to interconnection line distance and variation in size due to mask misalignment differs between a memory cell transistor and a peripheral transistor. Specifically, in a memory cell array, a signal line (a bit line or a source line) is disposed in proximity to a memory cell transistor which accumulates electrons in a floating gate or the like. When electrons are accumulated in the floating gate, a potential of the floating gate is maintained to be not higher than a ground potential, for example. The potential of the adjacent signal line is not lower than the ground potential in normal operation. When a distance between the signal line and the floating gate is shortened, an electric field between the proximal signal line and the floating gate is enlarged to cause leakage of accumulated charges from the floating gate to the proximal signal line through charge trap levels in an interlayer insulating film, thereby deteriorating data retention characteristics. Since the charge trap level in the interlayer insulating film is produced due to a defect of the film and the presence of impurities, charge trap levels inevitably exist to some extent.

Accordingly, when a memory transistor is laid out according to the same design rule (minimum design dimensions) as that for the peripheral transistor, if due to mask misalignment in a manufacturing steps, variation in manufacturing parameters, such as deviation in overlapping between a floating gate and a proximal signal line and variation in dimension is caused to shorten a distance between the proximal signal line and the floating gate, a problem of deterioration of charge retention characteristics occurs in the memory transistor to reduce a yield and reliability even when such a problem as short-circuit does not occur in the peripheral transistor.

While Prior Art Document 1 considers the gate contact failure, it fails to consider such leakage of accumulated charges from a floating gate to a proximal or close signal line (source line).

In Prior Art Document 2, in order to form an opening for formation of drain and source contacts with high precision, an interlayer insulating film formed on a field insulating film is used as a mask. Prior Art Document 2, however, only intends to improve the contact failure and neither account for the problem of mask misalignment in the case where a source line and a bit line are disposed in proximity to the memory cell transistor nor suggests even existence of the problem of charge leakage.

Prior Art Document 3 intends to achieve reduction in cell size and step between a peripheral circuit and a memory array by connecting a single gate transistor in series to for use as a nonvolatile memory cell component. Prior Art Document 3, however, considers neither charge leakage nor charge retention characteristics.

SUMMARY OF THE INVENTION

An object of the present invention is to provide a programmable nonvolatile memory which can maintain reliability of stored data even when a manufacturing parameter varies due to mask misalignment or the like in a manufacturing step, and a semiconductor integrated circuit device using the same.

A programmable nonvolatile memory according to one aspect of the present invention includes a memory cell including a memory cell transistor for storing data in a nonvolatile manner according to the amount of accumulated charges. The memory cell transistor includes first and second impurity regions formed in a substrate region, and a charge accumulation region arranged on the substrate region between the first and second impurity regions.

The programmable nonvolatile memory according to one aspect of the present invention further includes a first conductive line arranged corresponding to the memory cell transistor, a first contact for electrically connecting the first impurity region with the first conductive line, and a peripheral transistor arranged in a region different from a memory cell arranging region on a common semiconductor substrate and used in a function other than data storage. The peripheral transistor has third and fourth impurity regions formed on the surface of the semiconductor substrate and a control gate formed above the semiconductor substrate between the third and fourth impurity regions for receiving a signal for setting an on/off state thereof.

The programmable nonvolatile memory according to one aspect of the present invention further includes a second conductive line arranged corresponding to the peripheral transistor and a second contact for electrically connecting the third impurity region with the second conductive line. A distance between the first contact and a floating gate of the memory cell transistor along a direction connecting the first and second impurity regions and a distance between the control gate of the peripheral transistor and the second contact along a direction connecting the third and fourth impurity regions are set according to different design rules.

A semiconductor integrated circuit device according to another aspect of the present invention includes first and second memory cells arranged facing with each other and each having a memory cell transistor for storing data in a nonvolatile manner, a first conductive line arranged between the first and second memory cells and coupled in common to the memory cell transistors of the first and second memory cells through a first contact, a peripheral transistor arranged in a different region on a common semiconductor substrate from a region for the first and second memory cells and having its conduction/non-conduction state set according to a voltage applied to its control gate to provide a function different from data storage, and a second conductive line connected to the peripheral transistor through a second contact for transmitting/receiving a signal or a voltage to/from the peripheral transistor.

A distance between the memory cell transistors of the first and second memory cells and the first contact is set based on a design rule different from that for a distance between the control gate of the peripheral transistor and the second contact.

A distance between a charge accumulation region, e.g. the floating gate, of the memory cell transistor and a contact for the associated signal line and a distance between the control gate of the peripheral transistor and a contact for the associated signal line are set or determined based on different design rules. Thus, even when the distance between the charge accumulation region of the memory cell transistor and the signal line is shortened due to mask misalignment and others, an electric field between the charge accumulation region and the signal line can be set at an intensity level of suppressing leakage of charges accumulated in the charge accumulation region through a trap level. As a consequence, deterioration of charge retention characteristics of the memory cell transistor can be suppressed. In addition, for the contact of the peripheral transistor, a gate to contact distance can be set according, for example, to minimum design dimensions such that coupling between an impurity diffusion resistance and the control gate, and the signal line is minimized, thereby achieving stable high-speed operation.

Thus, even in a device having a memory circuit and a peripheral circuit such as a logic circuit integrated on a common semiconductor substrate, a memory cell and the peripheral circuit can be manufactured in the same manufacturing steps while maintaining reliability of a memory transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
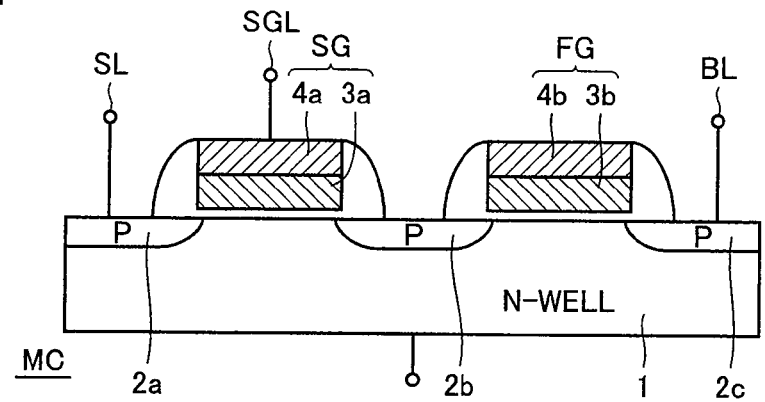
FIG. 1 is a diagram schematically showing a sectional structure of a memory cell according to a first embodiment of the present invention.

FIG. 1 is a diagram schematically showing a sectional structure of a memory cell used in a programmable memory (nonvolatile memory) according to the present invention. In FIG. 1, a memory cell MC includes P type impurity regions 2a, 2b and 2c formed at spaces on the surface of an N type well region (semiconductor substrate region: N well) 1, a selection gate SG formed on the N well 1 between impurity regions 2a and 2b with a gate insulating film laid thereunder, and a floating gate FG formed on N well 1 between impurity regions 2b and 2c with a gate insulating film laid thereunder.

Selection gate SG includes a first electrode layer 3a formed, for example, of polysilicon, and a second electrode layer 4a of a low resistance formed, for example, of tungsten silicide and in contact with first electrode layer 3a. Floating ate FG similarly includes a first electrode layer 3b and a second electrode layer 4b. Selection gate SG and floating gate FG are formed into a double-layer electrode structure, to reduce an interconnection resistance of selection gate SG and to enable selection gate SG and floating gate FG to be formed through the same manufacturing steps. Selection gate SG is disposed continuously extending over a plurality of memory cells and transmits a selection signal on a selection gate line SGL commonly to corresponding memory cells.

Impurity region 2a is connected to a source line SL and impurity region 2c is connected to a bit line BL. Source line SL and bit line BL are arranged extending in a direction intersecting with selection gate line SGL and connected to a plurality of memory cells.

Memory cell MC shown in FIG. 1, is the same, in its sectional structure itself, as the memory cell shown in Prior Art Document 3. Prior Art Document 3, however, fails to describe the details of an electrode structure of selection gate SG and the floating gate.

Memory cell MC is comprised of P channel MOS transistors (insulated gate type field effect transistors) connected in series between source line SL and bit line BL. According to the amount of accumulated charges of floating gate FG, an inversion layer is selectively formed between impurity regions 2b and 2c.

Figure 2:
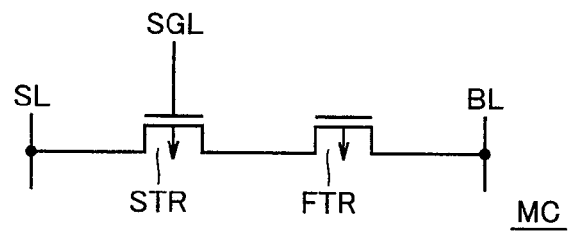
FIG. 2 is a diagram showing an electrically equivalent circuit of the memory cell shown in FIG. 1.

FIG. 2 is a diagram showing an electrically equivalent circuit of memory cell MC shown in FIG. 1. As shown in FIG. 2, memory cell MC includes a selecting transistor STR and a floating gate transistor FTR which are connected in series between source line SL and bit line BL. A control gate of selecting transistor STR corresponds to selection gate SG shown in FIG. 1 and is connected to selection gate line SGL. A control electrode of floating gate transistor FTR is set at an electrically floating state. Accordingly, when selection gate line SGL is driven into a selected state and selecting transistor STR turns into a conductive state, current flows between source line SL and bit line BL according to the conduction/non-conduction state of floating gate transistor FTR. The conduction state and non-conduction state of floating gate transistor FTR are correlated with the respective logical values of binary data.

Figure 3:
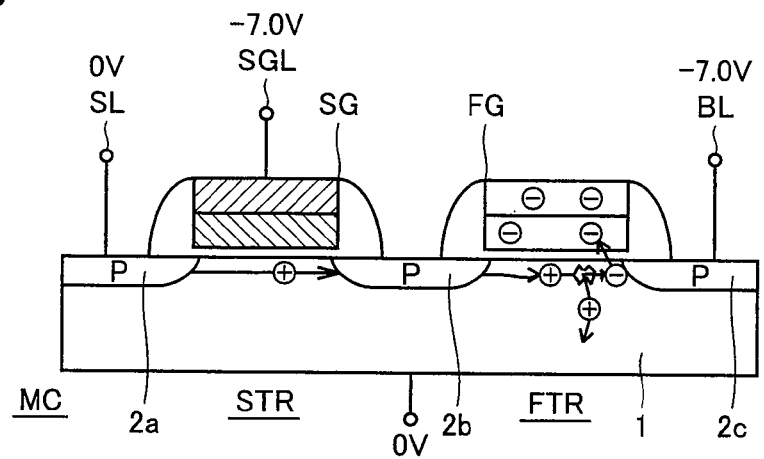
FIG. 3 is a diagram showing the voltage applied in writing to the memory cell shown in FIG. 1.

FIG. 3 is a diagram showing one example of applied voltages in writing to memory cell MC. In a writing mode, 0V is applied to source line SL and −7.0V is applied to selection gate line SGL and to bit line BL. To N well 1 of the substrate region, 0V is applied. For selecting transistor STR, a negative voltage of −7.0 V is applied to selection gate SG to form a channel between impurity regions 2a and 2b, so that holes move from impurity region 2a to impurity region 2b. Floating gate FG has no charges accumulated at an initial state (erased state), and has its voltage level transited to a negative voltage (e.g. −1.0V) due to capacitive coupling with bit line BL according to the application of a negative voltage to bit line BL. As the potential is decreased due to the capacitive coupling, an inversion layer is formed between impurity regions 2b and 2c, so that holes move from impurity region 2b toward impurity region 2c. The holes in the channel region of floating gate transistor FTR are accelerated by a high electric field generated by the negative voltage applied to bit line BL to make channel hot holes to form electron-hole pairs. Of the hole-electron pairs generated by acceleration of the holes, hot electrons are accelerated by a high electric field caused by the voltage −7.0 applied to impurity region 2c, to be injected into floating gate FG. Hot holes are released to a ground node through N well 1 of the substrate region. As electrons are injected into floating gate FG, the potential of floating gate FG is decreased to further reduce the resistance of the inversion layer in the channel region (floating gate transistor FTR enters a strongly on state), so that more channel hot electrons are generated and injected into floating gate FG.

A potential difference between floating gate FG and bit line BL is reduced due to electron injection, to reduce an accelerating electric field in the vicinity of a drain of floating gate transistor FTR, so that injection of the electrons into floating gate FG is stopped. In the state where the electrons are injected into floating gate FG, the potential of floating gate FG is, for example, at a negative voltage level (e.g. −3v), so that an inversion layer is formed between impurity regions 2b and 2c normally all the time and floating gate transistor FTR is in the normally conductive state.

When no injection of electrons into floating gate FG is made, floating gate transistor FTR has the floating gate maintained at its initial state of the ground potential level and is equivalently in the state of having a threshold voltage of a large absolute value. In storing binary data, the conduction state and non-conduction state of floating gate transistor FTR are correlated with logical values "0" and "1" of the stored data.

In the above description, channel hot electrons are generated and injected into the floating gate. A drain high electric field may, however, be produced by a voltage applied to bit line BL to generate and inject drain avalanche hot electrons into floating gate FG.

Figure 4:
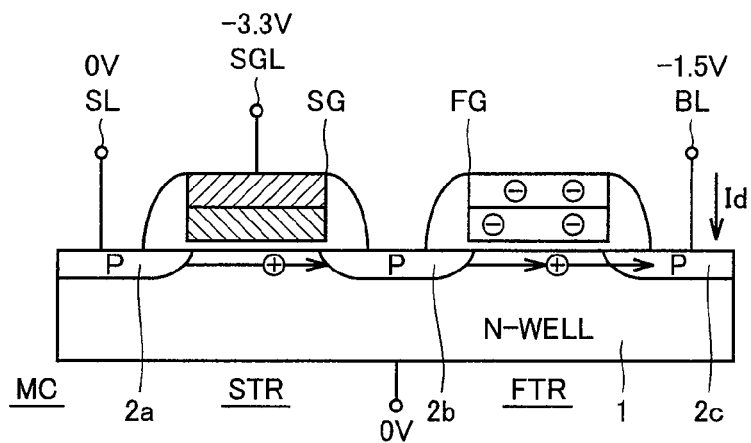
FIG. 4 is a diagram showing the voltage applied in data reading from the memory cell shown in FIG. 1.
Figure 5:
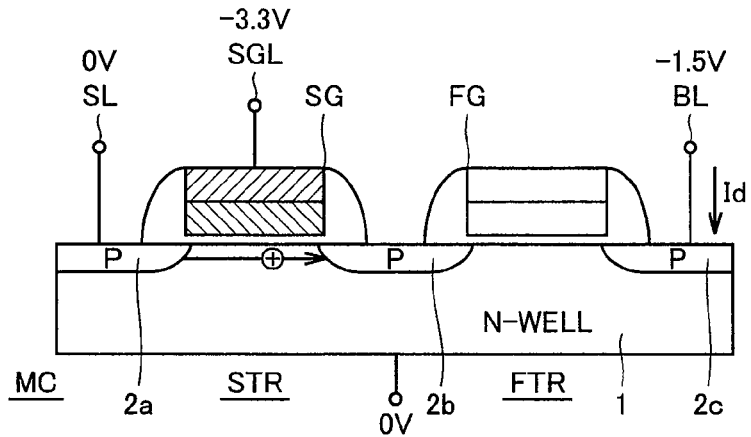
FIG. 5 is a diagram showing an applied voltage in data reading from the memory cell shown in FIG. 1.

FIG. 4 and FIG. 5 are diagrams showing an applied voltage in reading stored data of memory cell MC. FIG. 4 shows a state where charges (electrons) are accumulated in floating gate FG and FIG. 5 shows a state where no electron is accumulated in floating gate FG, or the initial state.

As shown in FIG. 4 and FIG. 5, at the time of data read, a ground voltage (0V) is applied to source line SL and N well (substrate region) 1. −3.3 V is applied to selection gate line SGL and −1.5 V is applied to bit line BL.

As shown in FIG. 4, with charges (electrons) accumulated in floating gate FG, an inversion layer is formed in floating gate transistor FTR. Accordingly, holes supplied from source line SL through impurity regions 2a and 2b move to bit line BL through impurity regions 2b and 2c (in a PMOS transistor, majority carrier is hole). In this state, therefore, drain current (current flowing from bit line BL to source line SL) Id of −40 μA, for example, flows.

On the other hand, as shown in FIG. 5, in the state where no charge is accumulated in floating gate FG, no inversion layer is formed or a weak inversion layer is formed between impurity regions 2b and 2c in floating gate transistor FTR. In this case, even when a negative −1.5 V is applied to bit line BL to drive floating gate FG to a negative potential through capacitive coupling, the potential change of floating gate FG due to the capacitive coupling is not greater than a threshold voltage (for example, a threshold voltage of floating gate transistor FTR is set to −1.5V).

Accordingly, even when selecting transistor STR enters the conductive state in response to a negative voltage (−3.3V) on selection gate line SGL to supply holes to impurity region 2b, no holes of the majority carriers move to impurity region 2c. As a result, current barely flows or even if it flows, the drain current (bit line current) Id is as small as approximately −1 μA. Therefore, by detecting drain current Id in a read circuit not shown, the data stored in the memory cell can be read.

For the memory cell MC, selecting transistor STR and floating gate transistor FTR both have a single-layer gate and have the same structure as that of an ordinary single gate MOS transistor. Memory cell MC accordingly has advantages that it can be formed through the same manufacturing steps as a peripheral circuit and that as compared with a stacked gate type MOS transistor having a double-layer gate of a floating gate and a control gate, a step (difference in height) between memory cell MC and a peripheral transistor is small to enable simplification of a manufacturing process.

Figure 6:
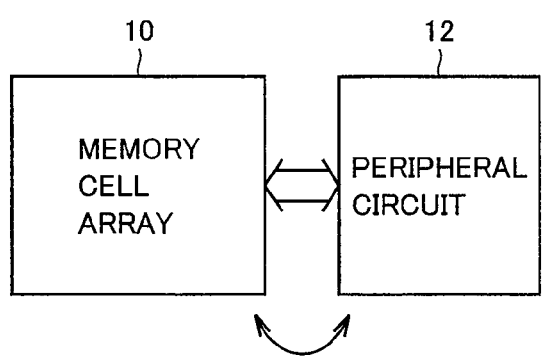
FIG. 6 is a diagram schematically showing the entire construction of a programmable memory according to the first embodiment of the present invention.

Accordingly, as shown in FIG. 6, a memory cell array 10 including memory cells MC and a peripheral circuit 12 for executing an operation related to data write/read on memory cell array 10 can be manufactured on the same semiconductor substrate through the same manufacturing process and steps. In the case where a transistor of the memory cell in memory cell array 10 and a transistor of peripheral circuit 12 (hereinafter referred to as a peripheral transistor) are formed through the same manufacturing steps, when the memory cell transistor and the peripheral transistor are designed (laid out) based on the same design rule (minimum design dimensions) for circuit designing, the problem of data retention characteristics arises as described previously. Thus, for memory cell array 10 and peripheral circuit 12, the design rule applied to a distance between floating gate FG and a contact with the bit line BL is made different from a design rule for a distance between a control gate of the peripheral transistor and a contact with a corresponding signal line.

Specifically, in the case of forming a MOS transistor or the like, it is a common practice to design a contact position with mask misalignment in a manufacturing step taken into account. The bit line contact (drain contact) is formed in general with photolithography and etching technique after self-alignedly forming impurity regions 2a to 2c by impurity ion implantation subsequent to formation of floating gate FG and selection gate SG. Accordingly, considering mask misalignment, a distance between a contact and a gate (a control gate and a floating gate) is set so as to prevent short-circuit between the gate and the contact. With respect to the gate-contact distance, different design rules are applied to the floating gate and to the peripheral transistor.

As to design rules for the other portions, the same design rule is applied as much as possible. Specifically, expect for a distance between floating gate FG of floating gate transistor and a contact with bit line BL in memory cell array 10, the same design rule is applied to the common portions in the memory array and the peripheral circuitry to improve design efficiency.

Figure 7:
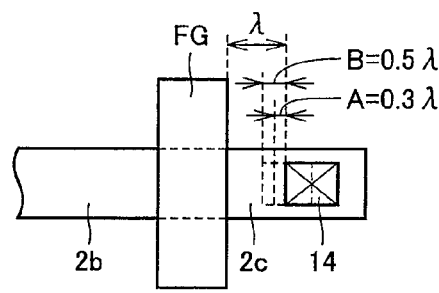
FIG. 7 is a diagram schematically showing relative positions of a drain contact and a floating gate of the memory cell shown in FIG. 1 when a distance between the floating gate and the drain contact is set based on a minimum design rule.

Now, a case is considered as shown in FIG. 7, in which for floating gate FG, the distance λ is applied as the distance to the drain contact 14 connected to a bit line based on a design rule defining the minimum design rule (minimum processing dimension). Also as to the peripheral transistor, a distance between a gate and a contact is determined based on the same design rule. Now, a case is considered in which a position of drain contact 14 with respect to floating gate FG is displaced by A and B due to mask misalignment (any of floating gate FG and the drain contact may be displaced). The amounts A and B of displacement of superposition between masks (the mask for the floating gate and the mask for the drain contact) are assumed to be 0.3λ and 0.5λ, respectively. Accordingly, in a case of the amount A of displacement of superposition, the distance between floating gate FG and drain contact 14 will be 0.7λ and in the case of the amount B of displacement of superposition, the distance between floating gate FG and drain contact 14 will be 0.5λ.

In the case of an ordinary single-gate MOS transistor, the short circuit between the gate and drain contact 14 can be prevented, and a displacement of superposition causes no problem in transistor operation characteristics even in the case of the amount B of displacement, provided that a coupling capacitance is small. When charges are accumulated in floating gate FG to store data, however, the following problem arises.

Figure 8:
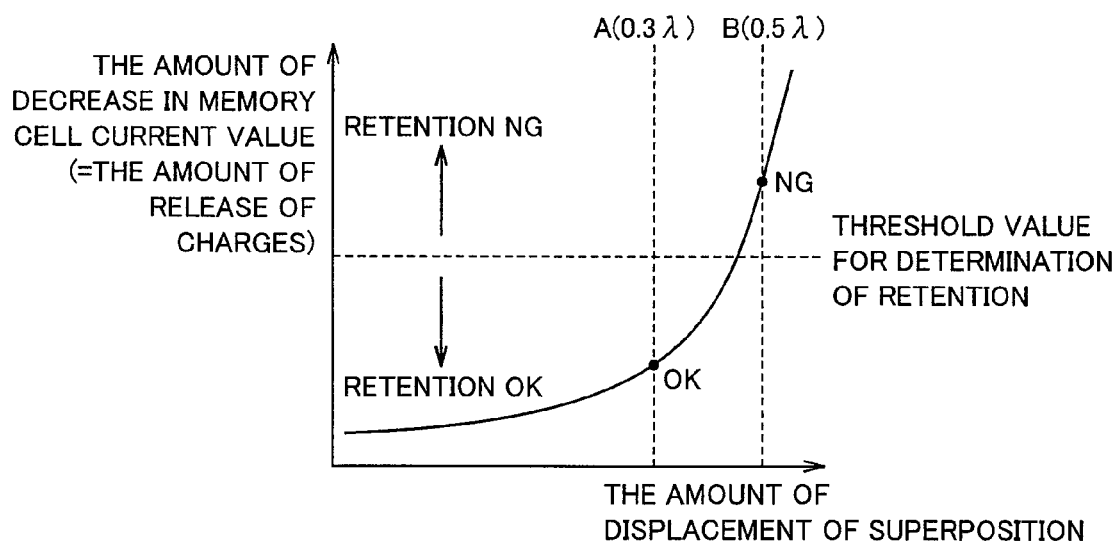
FIG. 8 is a diagram showing a relationship between the distance between the floating gate and the drain contact of the memory cell shown in FIG. 1 and a memory cell current.

FIG. 8 is a diagram representing a relationship between the amount of displacement of mask superposition and the amount of decrease in a memory cell current value. The abscissa represents the amount of displacement of mask superposition and the ordinate represents the amount of decrease in a memory cell current value (the amount of charge leakage (the amount of release)). A threshold value for determining data retention denotes a reference current value as a criterion for determination at the time of memory cell read. Measurement is made after a lapse of 100 hours since writing of charges.

As shown in FIG. 8, in the case of the amount A of displacement of mask superposition, the amount of decrease in memory cell current is small to be able to store the written data accurately (OK). On the other hand, in the case of the amount B of displacement of mask superposition, the amount of decrease in memory cell current value is large, and the amount of memory cell current is so reduced as to determine that no charge (electron) is accumulated, resulting in erroneous data read (NG).

Meanwhile, memory cell current (drain current) in the measurement is obtained by folding back the decrease amount curve with a line indicative of the determination threshold value being an axis of symmetry in FIG. 8.

Therefore, even when an individual mask misalignment is within an allowable range, there is a case where relative displacement between the mask for forming the floating gate and the mask for forming the drain contact is large, and when displacement of 0.5λ is caused due to displacement of mask superposition indicative of relative displacement, reliability of the memory will be degraded. Such deterioration of data retention characteristics originated from displacement of mask superposition or mask misalignment is found by the inventors. It is therefore necessary to accurately maintain data retention characteristics even when such mask misalignment (displacement of mask superposition) occurs.

First, before considering a countermeasure, a cause of leakage generation will be considered. Leakage of accumulated charges in the floating gate due to the displacement of a relative position of the drain contact is deemed to be caused by the following mechanism.

Figure 9:
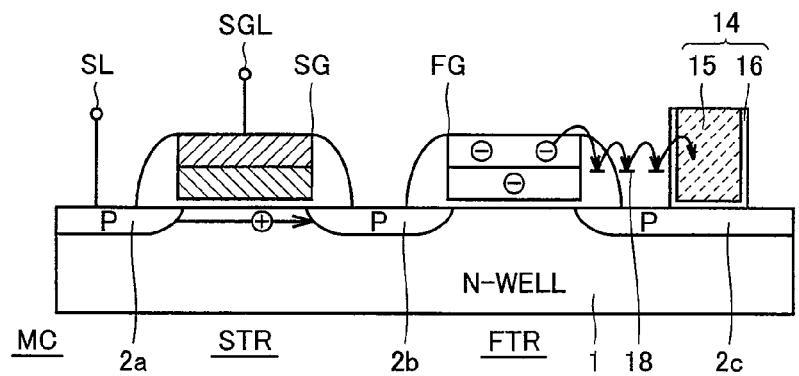
FIG. 9 is a diagram schematically showing a leakage path between the floating gate and the drain contact.

FIG. 9 is a diagram specifically showing a structure of the drain contact of the memory cell. In FIG. 9, drain contact 14 includes a metal interconnection 15 formed, for example, of aluminum and connected to a bit line, and a barrier metal 16 formed between metal interconnection 15 and impurity region 2c. Barrier metal 16 is used, when metal interconnection 15 is formed of aluminum and N well (semiconductor substrate region) 1 is a silicon semiconductor substrate region, for preventing penetration of the aluminum (a phenomenon that metal interconnection 15 reaches substrate region (N well) 1 through impurity region 2c) due to eutectic reaction between the aluminum and the silicon and for forming ohmic electrical connection between drain contact 14 and impurity region 2c.

Between floating gate FG and drain contact 14, formed is an interlayer insulating film made of a TEOS film (tetraethyl orthosilicate film). In the interlayer insulating film, a charge trap level 18 for trapping charges exists. Charges (electrons) stored in floating gate FG move through charge trap levels 18 due to an electric field between drain contact 14 and floating gate FG. Drain contact 14 is connected to the bit line and is at −1.5V in data reading and the floating gate FG is at a voltage level of approximately −3.0V when in a programmed or written state. Accordingly, because the potential of drain contact 14 is higher, the electrons sequentially move through charge trap levels 18 due to the electric field between floating gate FG and drain contact 14, so that the charges (electrons) accumulated in floating gate FG disappear.

The degree of the charge leakage depends on the intensity of the electric field between floating gate FG and drain contact 14. Accordingly, when the distance between drain contact 14 and floating gate FG is shortened, a large amount of charges (electrons) flow out to drain contact 14 through charge trap levels 18, to deteriorate data (charge) retention characteristics. Such charge trap levels 18, although depending on a film quality and a density of an interlayer insulating film, unavoidably exist to some extent because lattice failures or impurities inevitably exist by a certain rate in the interlayer insulating film.

For suppressing such leakage of charges (electrons) accumulated in the floating gate which is caused by mask misalignment, the following countermeasures are taken. Deviation in the distance between the floating gate and the drain contact occurs not only by mask misalignment but also by difference of a floating gate size from a design value due to variation of a process parameter. In the following description, displacement of a relative position or variation in the distance between a floating gate and a drain due to such parameter variation will be referred to as "displacement of superposition" or "displacement of mask superposition" unless otherwise noted.

Figure 10:
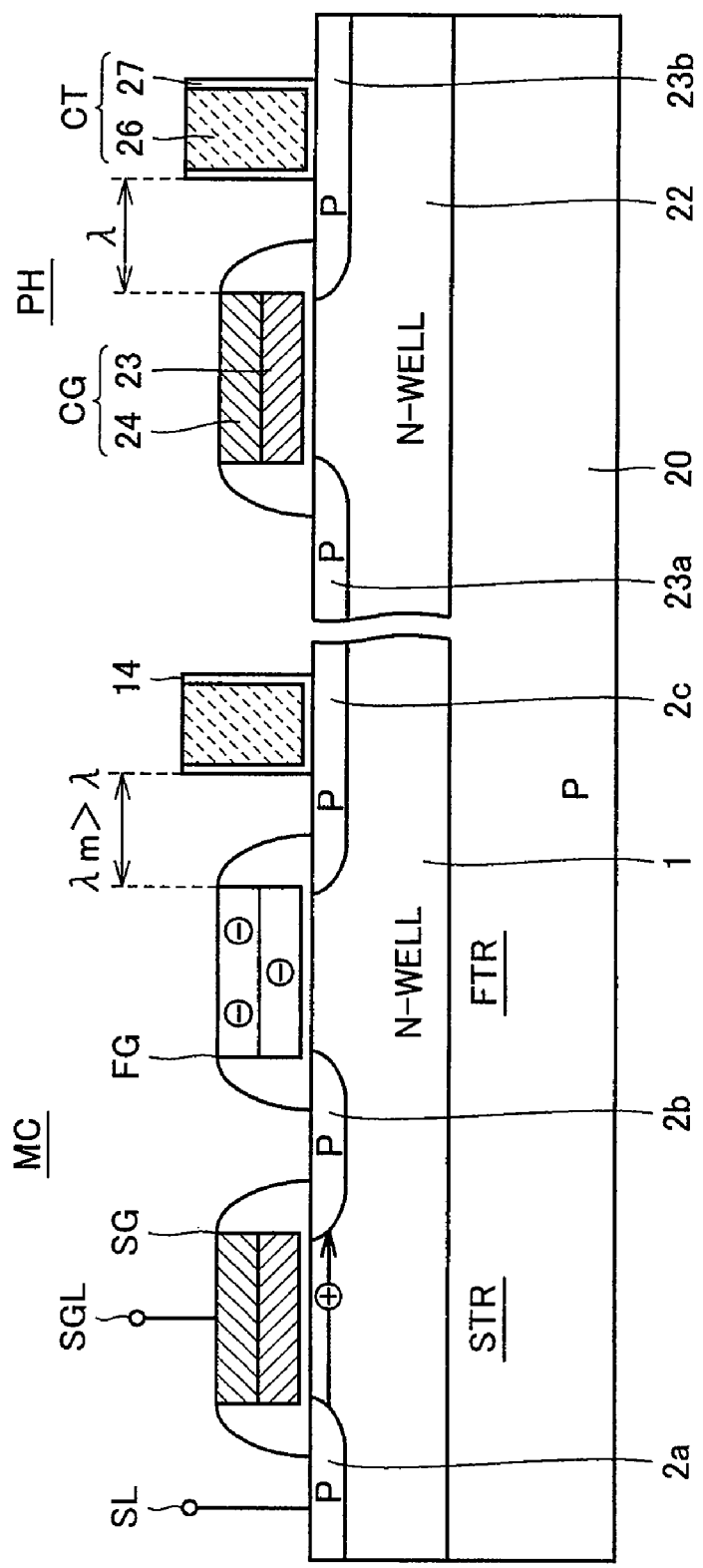
FIG. 10 is a diagram schematically showing a sectional structure of the memory cell and a peripheral transistor of the programmable memory according to the first embodiment of the present invention.

FIG. 10 is a diagram schematically showing sectional structures of a transistor of a memory cell and a transistor of a peripheral circuit in a semiconductor integrated circuit device according to the first embodiment of the present invention. Memory cell MC and a peripheral transistor PH of the peripheral circuit are formed on a common semiconductor substrate 20. Memory cell MC is formed in N well 1 on P type semiconductor substrate 20 and includes impurity regions 2a to 2c, selection gate SG and floating gate FG. To impurity region 2c, drain contact 14 is electrically connected. The structure of memory cell MC is the same as that of the memory cell previously shown in FIG. 1.

Peripheral transistor PH is formed in an N well 22 located in another region on P type semiconductor substrate 20 and includes P type impurity regions 23a and 23b formed apart at the surface of N well 22, a control gate CG formed on the surface of N well 22 between impurity regions 23a and 23b, and a contact CT electrically connected to impurity region 23b.

Control gate CG includes a first electrode layer 23 formed of polysilicon, for example, and a second electrode layer 24 formed of tungsten silicide, for example, and in contact with first electrode layer 23. Contact CT includes a barrier metal layer 27 in contact with impurity region 23b and a plug 26 covered with barrier metal layer 27. Transistors STR and FTR of memory cell MC and peripheral transistor PH are designed (laid out) based on a rule of the same minimum design dimension expect for the following points. In peripheral transistor PH, a distance between control gate CG and contact CT along the direction connecting impurity regions 23a and 23b is set to be λ based on the design rule (minimum design dimension). On the other hand, in memory cell MC, a distance λm between floating gate FG and drain contact 14 along impurity regions 2b and 2c is set to be greater than the distance λ that is determined based on the design rule (minimum design rule) defining the minimum design dimension, and is set based on a different designing rule. The distance λm between the floating gate and the drain contact is preferably set to be not less than 1.2 λ.

Even when the distance between control gate CG and contact C in peripheral transistor PH attains 0.5λ due to displacement of mask superposition, no short circuit occurs because control gate CG and contact CT are electrically isolated by an interlayer insulating film. Since control gate CG only transmits a control signal or a fixed voltage and does not accumulate charges for information storage, the problem of charge leakage does not arise.

On the other hand, even when displacement of mask superposition of 0.5λ occurs in memory cell MC, the floating gate to drain contact distance λm, when originally set to 1.2λ, will be 0.7λ. Accordingly, as shown in FIG. 8, also in this case, displacement of mask superposition equivalently exists at the position of A and charges can be stably retained, resulting in suppressed degradation of charge retention characteristics.

Accordingly, by setting the floating gate to drain contact distance λm in memory cell MC to be a value larger than the control gate to contact distance λ which is determined based on the design rule (minimum design dimension) of peripheral transistor PH, a margin for displacement of mask superposition can be increased to retain charges stably.

The floating gate to drain contact distance λm is set in consideration of a range of possible amount of displacement of superposition based on an allowance of mask misalignment and also based on a value of the distance λ to the contact in the minimum design rule of peripheral transistor PH and memory cell MC. For example, where the floating gate to drain contact distance λm is set to 1.1λ, even if 0.5λ of displacement of mask superposition occurs, the distance λm is 0.6λ, so that from the characteristic curve shown in FIG. 8, data retention characteristics can be guaranteed. Since the floating gate to drain contact distance λm in memory cell MC is merely set to a value greater than the control gate to contact distance λ which is set based on the minimum design dimension (design rule) of peripheral transistor PH and as to the remaining parameters, the same design rules are applied, the peripheral circuit and the memory array can be laid out based on substantially the same design rules and formed through the same manufacturing steps.

Figure 11:
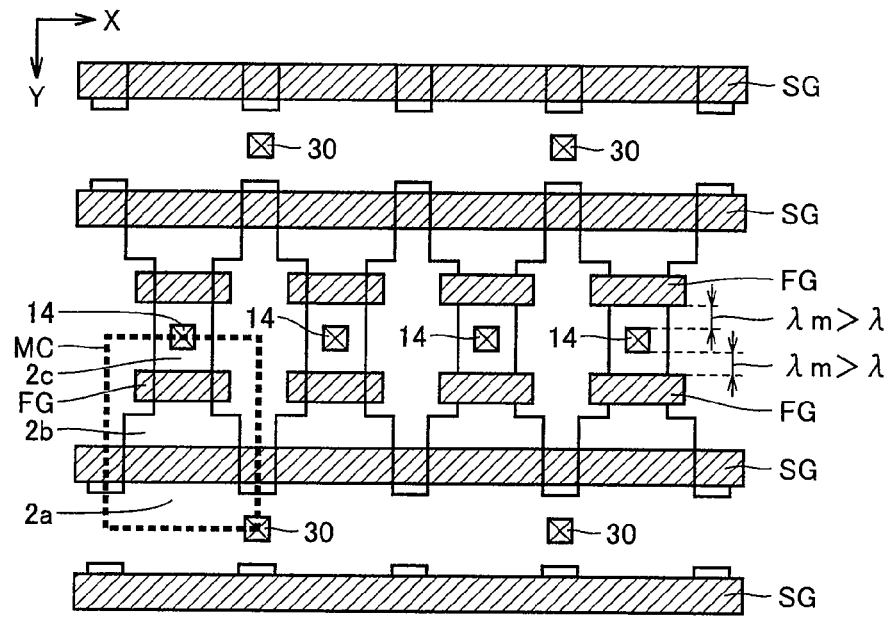
FIG. 11 is a diagram schematically showing a planar layout of the memory cell according to the first embodiment of the present invention.

FIG. 11 is a diagram schematically showing a planar layout of a memory cell array including the memory cell according to the first embodiment of the present invention. In FIG. 11, memory cells MC are arranged aligning in an X direction and a Y direction. Between memory cells MC adjacent to each other in Y direction, a drain contact 14 is disposed. Memory cells MC are formed into symmetric forms with respect to drain contacts 14 in Y direction. Floating gates FG are arranged aligning along X direction on opposite sides of the respective drain contacts 14 in Y direction, at the distance λm relative to the drain contact. Selection gate SG is continuously disposed extending along X direction on the outside of floating gates FG in Y direction. Between selection gates SG, source contacts 30 are formed aligning in Y direction. Source contacts 30 are coupled to the impurity region (2a) formed continuously extending in X direction. In X direction, drain contacts 14 and source contacts 30 are disposed alternately. Source contacts 30 are disposed one for each two memory cells located adjacent to each other in X direction.

Memory cell MC includes impurity region 2c between floating gate FG and drain contact 14, impurity region 2b between floating gate FG and selection gate SG and impurity region 2a located outside selection gate SG. Impurity region 2a is coupled to source contact 30 in the vicinity. A spool-shaped region (a region formed by a wide rectangular region at the center and a narrow extruding rectangular region at the opposite ends) between memory cells MC is an element isolation region, at which a field insulating film or a shallow trench isolation structure formed to isolate memory cells aligned in X direction from each other.

The layout shown in FIG. 11 is repeatedly arranged in X direction, and in Y direction, the layout shown in FIG. 11 is repeatedly arranged being folded back every selection gate line pair to be symmetric with respect to selection gate SG.

As shown in FIG. 11, drain contact 14 is shared between memory cells MC adjacent in Y direction. When displacement of mask superposition occurs, therefore, in one of memory cells sharing drain contact 14, the distance between floating gate FG and drain contact 14 will be greater than the design value λm and the distance between floating gate FG and drain contact 14 in the other memory cell will be shorter than the design value λm. Also for a memory cell having the distance between floating gate FG and drain contact 14 made shorter, with the amount of displacement being B, the floating gate to drain contact distance λm-B is maintained to be a distance causing no data inversion (λm is greater than λ). Thus, even with the layout in which drain contact 14 is shared between memory cells adjacent in Y direction, data retention characteristics can be reliably ensured.

Figure 12:
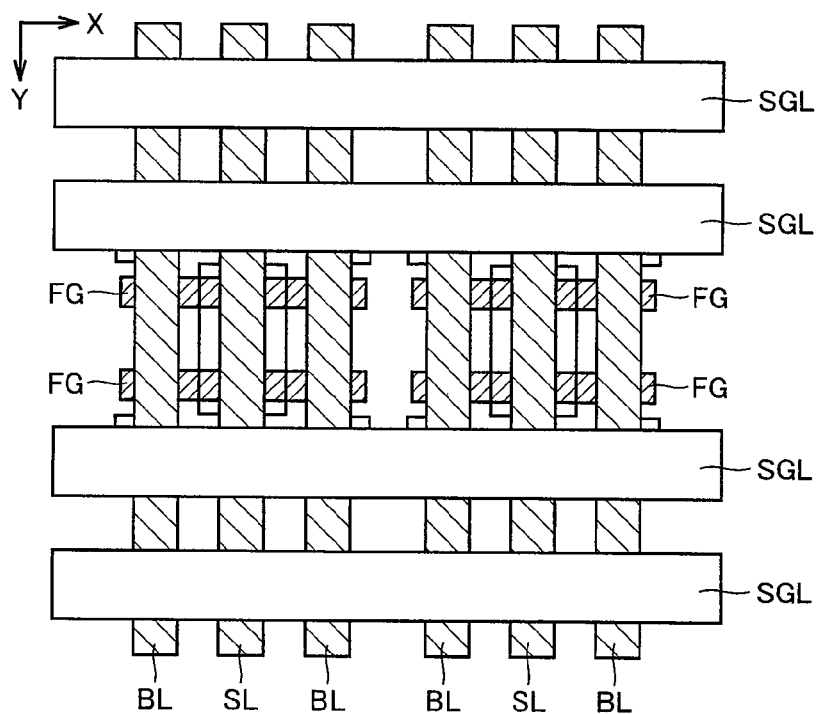
FIG. 12 is a diagram schematically showing a layout of a metal interconnection in an upper layer above the layout shown in FIG. 11.

FIG. 12 is a diagram schematically showing a layout of a metal interconnection of an upper layer for the layout of the memory cell array shown in FIG. 11. In FIG. 12, selection gate lines SGL are disposed on and aligned with selection gates SG and extend in X direction. In Y direction, bit line BL is arranged aligning with the drain contacts and source line SL is arranged aligning with the source contacts. Bit line BL and source line SL are formed with a first metal interconnection line, and selection gate line SGL is formed with a second metal interconnection lien at the upper layer. These metal interconnection lines are made with aluminum or copper being a main material.

Source line SL extends in Y direction to be electrically connected to source contacts 30 shown in FIG. 11. Selection gate line SGL is electrically connected to selection gates SG shown in FIG. 11 at predetermined pitches, to reduce an electrical resistance of selection gate SG. Bit line BL is coupled to drain contacts 14 shown in FIG. 11. Source line SL and bit line BL are arranged alternately.

Source line SL extends in Y direction and a source diffusion layer (impurity region 2a) shown in FIG. 11 extends in X direction. As to a source of memory cell MC, therefore, a diffusion resistance is decreased by source line SL to stably maintain the source potential at a predetermined potential level (ground voltage level).

Floating gate FG is in a floating state and does not connected to any metal interconnection line.

Figure 13:
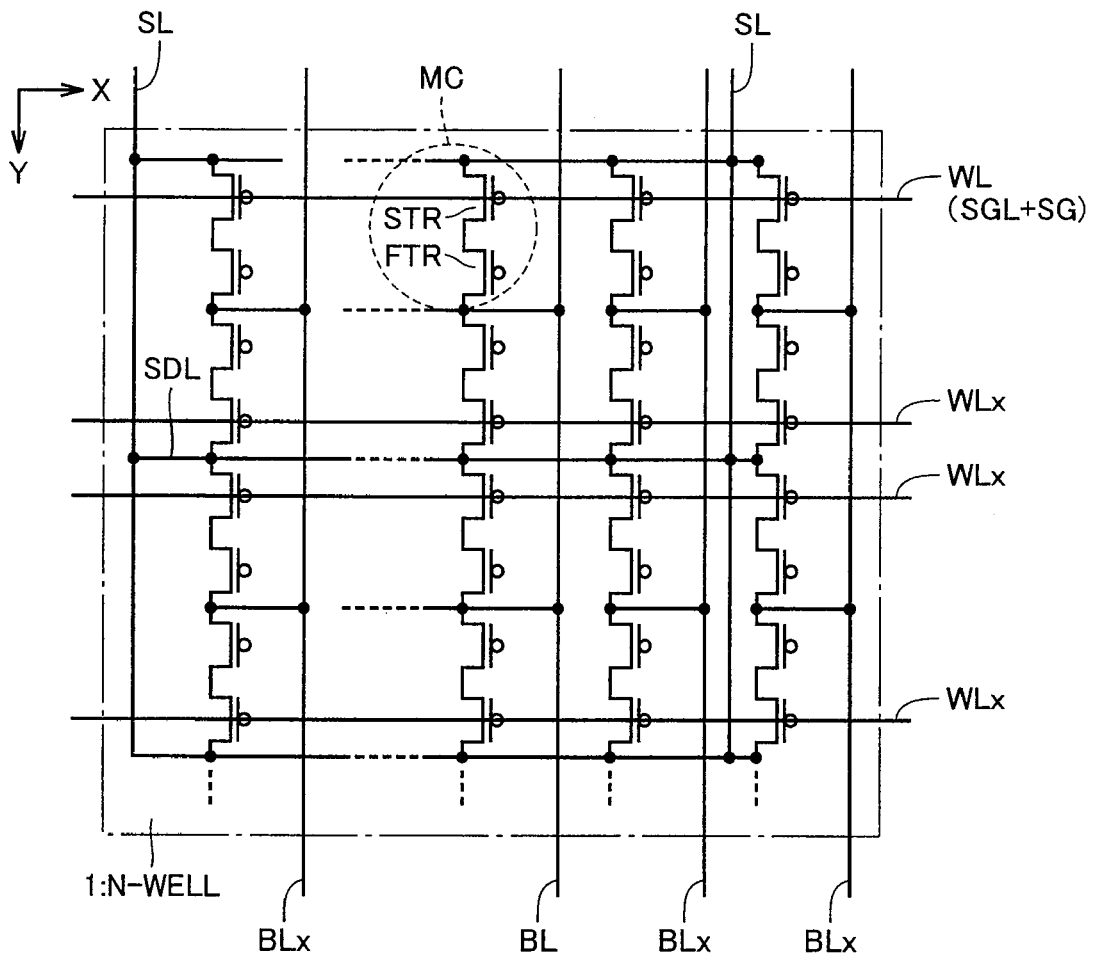
FIG. 13 is a diagram showing an electrically equivalent circuit of a memory cell array shown in FIGS. 10 and 11.

FIG. 13 is a diagram showing an electrically equivalent circuit of memory cell MC shown in FIG. 11 and FIG. 12. In FIG. 13, memory cells MC are arrayed in rows and columns. Word line (selection gate line SGL and selection gate SG) is commonly disposed for selection transistors STR in a row of memory cells MC aligned in X direction. A world line WL is disposed corresponding to each memory cell row. Bit line is disposed corresponding to each respective column of memory cells MC aligned in Y direction. Bit line BL is coupled to a drain of floating gate transistor STR. For each two bit lines, one source line SL is provided and each source line SL extends in Y direction. In a row of memory cells MC aligned in X direction, a source region of the corresponding selecting transistors STR are commonly connected by a diffusion layer SDL. Impurity region 2a shown in FIG. 10 is continuously extended in X direction to form diffusion layer SDL, which in turn is connected, at a crossing portion with source line SL, to the crossing source line SL. The memory cell array is formed in N well 1. In addition, an interconnecting portion, which connects bit line BL and floating gate transistor FTR of the corresponding memory cell, corresponds to a drain contact.

Now, it is assumed that in the memory cell array arrangement shown in FIG. 13, word line WL is selected, a word line WLx is in a non-selected state, bit line BL is in a selected state and a bit line BLx is in the non-selected state. All the selecting transistors STR connected to the selected word line WL enter an on state and selecting transistors STR connected to the non-selected word line WLx maintain a non-conductive state. In memory cell MC arranged at the crossing portion between the selected word line WL and the selected bit line BL, selecting transistor STR and floating gate transistor FTR are connected in series to selectively form a current path according to its storage data. Among memory cells MC shown in FIG. 13, for the memory cells adjacent in Y direction, the corresponding word lines WLx are in the non-selected state and the selecting transistors are at the non-conductive state to provide no path through which current flows. Since the non-selected bit line BLx is supplied with the same potential as that of source line SL, also for a memory cell arranged at a crossing portion between the non-selected bit line BLx and the selected word line WL, even when selecting transistor STR enters the on state, no current flows. Only the memory cell MC arranged corresponding to the crossing portion between the selected word line WL and the selected bit line BL can be subject to data write/read.

Figure 14:
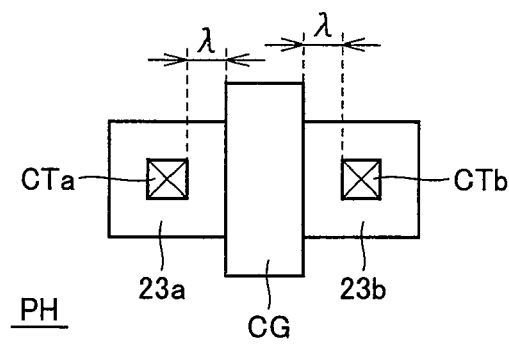
FIG. 14 is a diagram schematically showing a planar layout of the peripheral transistor.

FIG. 14 is a diagram schematically showing a planar layout of peripheral transistor PH formed on the same semiconductor substrate through the same manufacturing steps as the memory cell. Peripheral transistor PH includes impurity regions 23a and 23b and control gate CG disposed between these impurity regions 23a and 23b.

Depending on the function of the peripheral circuit in which peripheral transistor PH is arranged, the peripheral transistor PH has its connection state varied, and accordingly, connection states of contacts CTa and CTb provided corresponding to impurity regions 23a and 23b vary. Distances between control gate CG and contacts CTa and CTb are both set to be $\lambda$ based on the minimum design dimension (design rule).

In the layout of peripheral transistor PH shown in FIG. 14, whether contact CTa or CTb is a source is appropriately determined according to a purpose of application of peripheral transistor PH. In the case of a P channel MOS transistor, a drain contact corresponds to a terminal to which a potential not higher than a source potential is applied. Accordingly, in the case where a source terminal and a drain terminal are fixedly determined in peripheral transistor PH and the distances to the source contact and to the drain contact are different from each other, a distance of the floating gate transistor of the memory cell to the drain contact is set based on the distance $\lambda$ to the drain contact of peripheral transistor PH.

Control gate CS is manufactured through the same manufacturing steps as those of selection gate SG shown in FIG. 11. Selection gate line SGL is provided also for reducing a signal propagation delay by reducing an interconnection resistance of the word line in the memory array, and the second metal interconnection line in the same layer as the selection gate line is not necessarily connected to the control gate in the peripheral circuit.

For a memory cell, a single gate transistor is used and manufactured through the same manufacturing steps as those of the peripheral transistor. Only a design rule of the drain contact with respect to the floating gate transistor is modified, and the remaining design rules are made the same. Thus, designing and lay out of the memory cell and the peripheral circuit can be efficiently conducted to simplify the manufacturing process and steps.

As described in the foregoing, according to the first embodiment of the present invention, in the programmable memory, a distance between the floating gate transistor of the memory cell and the drain contact is set based on a different design rule from that for a distance between the control gate of the peripheral transistor and the contact to an adjacent signal line in the memory array peripheral circuit. Thus, data retention characteristics of the floating gate transistor of the memory cell can be improved. In particular, in the case where the distance between the control gate of the peripheral transistor and the contact is determined based on the minimum design dimension defined by the design rule, by setting the distance between the floating gate transistor of the memory cell and the drain contact to be longer than the distance between the control gate of the peripheral transistor and the associated contact, an electric field between the floating gate and the drain can be mitigated and even when mask misalignment due to process variation or displacement of mask superposition originated from dimension variation occurs, a sufficient distance can be ensured between the floating gate and the drain contact in the memory cell to suppress degradation of data retention characteristics.

Second Embodiment

Figure 15:
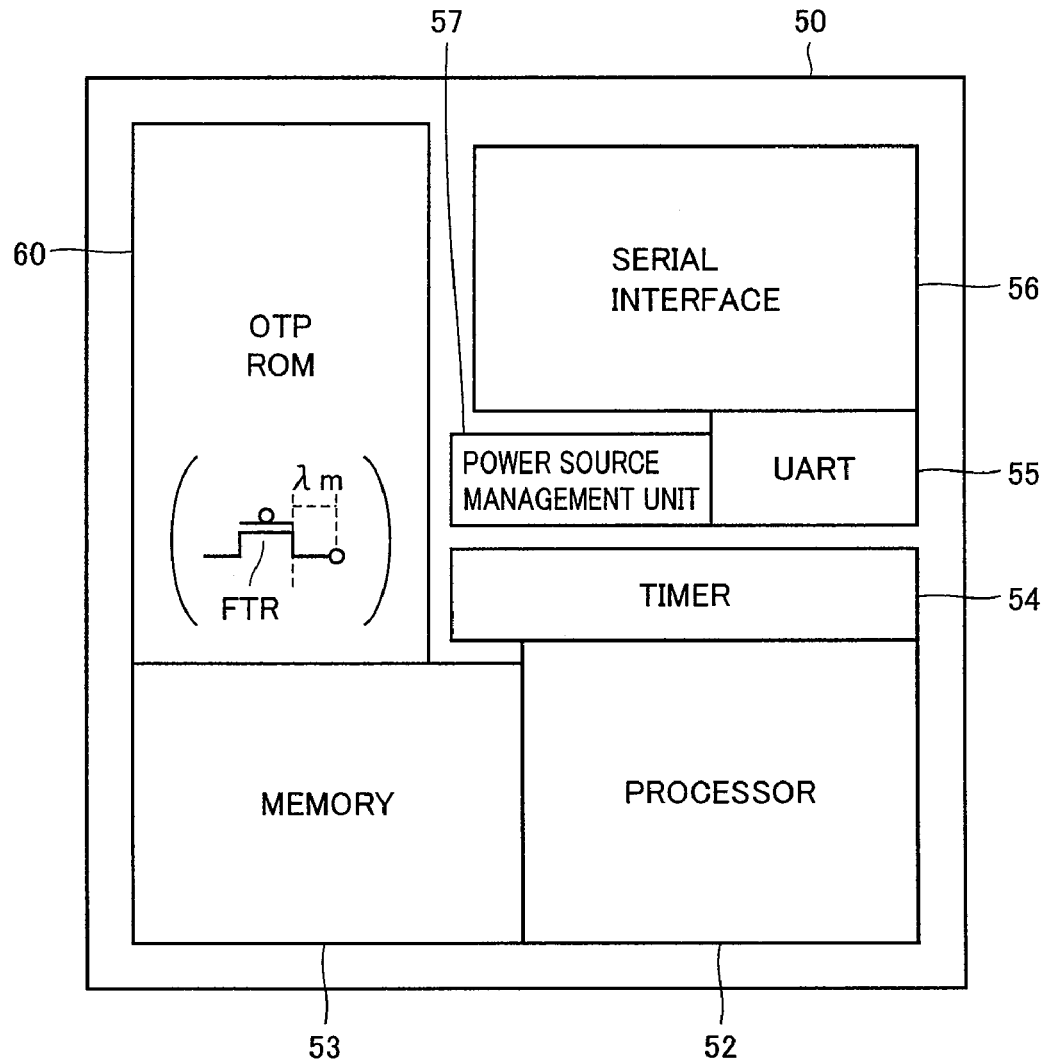
FIG. 15 is a diagram schematically showing the entire construction of a semiconductor integrated circuit device according to a second embodiment of the present invention.

FIG. 15 is a diagram schematically showing the entire structure of a semiconductor integrated circuit device according to a second embodiment of the present invention. In FIG. 15, a semiconductor integrated circuit device 50 includes a processor 52, a memory 53 which functions as a working area for processor 52 or other, a timer 54 which performs time management for the processing of processor 52, a universal asynchronous receiver transmitter (UART) 55 for executing conversion between a byte stream and a bit stream, a power source management unit (PWM) 57 for managing a power source, a serial interface 56 for serially transferring data in a bit stream form between UART 55 and the outside of the device, and an OTPROM 60 for storing fixed data such as a boot loader program and fonts.

Memory 53 is comprised of a RAM (Random Access Memory) or a flash memory (EEPROM). In OTPROM 60, a distance between a floating gate transistor FTR and a drain contact in a memory cell is set to be $\lambda m$ based on a rule different from the minimum design rule similarly to the above first embodiment. In a transistor of the peripheral unit (peripheral transistor) in semiconductor integrated circuit device 50 other than OTPROM60, a distance between a control gate and a source/drain contact is set to be $\lambda$ based on the minimum design dimension of the design rule similarly to the above first embodiment: $\lambda m > \lambda$.

Semiconductor integrated circuit device 50 shown in FIG. 15 is a one-chip microcomputer in which a transistor of a component is designed based on the minimum design rules except the above-described rule and formed by the same manufacturing process steps (even when memory 53 includes a DRAM (Dynamic Random Access Memory) and a flash memory, the memory cell of memory 53 is formed through the same manufacturing steps as those of a peripheral unit such as processor 52).

Accordingly, also in the case where in semiconductor integrated circuit device 50, various functional blocks (macro) are laid out and manufactured on the same semiconductor substrate based on the same design rule, since a distance of floating gate transistor FTR to the drain contact is set based on a rule different from the design rule defining the minimum design dimension (minimum design rule) in OTPROM 60, reliability of OTPROM 60 can be ensured even if mask misalignment and variation in dimension (size) of each part of the transistor occur during manufacturing of semiconductor integrated circuit device 50.

As described in the foregoing, according to the second embodiment of the present invention, also in a construction in which OTPROM and a peripheral device such as a processor are integrated on the same semiconductor substrate, the distance between the drain contact and the floating gate in the floating gate transistor in OPTROM 60 is set to a value different from a distance to a contact of a transistor in the peripheral unit set based on the minimum design rule (the design rule which defines the minimum design dimension). Thus, a semiconductor integrated circuit device including a highly reliable OTPROM which can be manufactured with the CMOS process can be provided.

Third Embodiment

Figure 16:
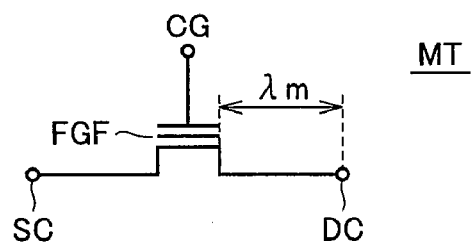
FIG. 16 is a diagram showing an electrically equivalent circuit of a memory cell according to a third embodiment of the present invention.

FIG. 16 is a diagram showing an electrically equivalent circuit of a memory cell according to a third embodiment of the present invention. In FIG. 16, a memory cell MT is comprised of a stacked gate type transistor having a floating gate FGF and a control gate CG. Floating gate type transistor has a source node (contact) SC and a drain node (contact) DC. Memory cell MT has its threshold voltage determined according to the amount of charges accumulated in floating gate FGF and has the amount of accumulated charges of the floating gate adjusted according to storage data.

For the case where such a stacked gate type transistor in which floating gate FGF and control gate CG are stacked as shown in FIG. 16 is used as a storage element, the structure of the present invention is similarly applicable.

Specifically, memory cell MT has its source and drain regions coupled to a source line and a bit line through source contact SC and drain contact DC, respectively. In this case, a distance between floating gate FGF and drain contact DC is set to be a distance $\lambda m$ greater than a dimension ($\lambda$) determined based on a minimum design rule of other peripheral transistor. In the peripheral transistor, a distance between the control gate and the source/drain contact is set to be $\lambda$ according to the minimum design rule. The peripheral transistor and memory cell MT are formed on the same semiconductor chip through he same manufacturing process and steps, as in the first and second embodiments.

A memory which utilizes a stacked gate type transistor as a memory cell can be also used as a collectively erasable PROM and an OTPROM. In the use as a ROM, only data read is executed after programming.

In the case where memory cell MT is an N channel transistor, source contact SC is maintained at a ground potential level through the source line in data reading. Drain contact DC is coupled to the bit line and supplied with a read voltage or a ground voltage depending on selection/non-selection of memory cell MT. Memory cell MT may possibly have the distance between the floating gate and the bit line shortened due to displacement of superposition to increase an electric field between the bit line and the floating gate in data reading. In particular, when a positive read voltage is supplied to a selected bit line in data reading, in a non-selected memory cell connected to the selected bit line, charges may leak from the floating gate to the bit line through an interlayer insulating film even with a control gate voltage being kept even at the ground voltage level. Such charge leakage in data reading can be suppressed by setting the distance between drain contact DC and floating gate FGF to be $\lambda m$ greater than the minimal distance $\lambda$.

Floating gate FGF enters a negative potential state when electrons are injected. In this case, even when control gate CG is in the non-selected state and maintained at the ground potential, source contact SC and drain contact DC are also at the ground voltage level in a non-selected memory cell, so that charges (electrons) might leak between drain contact DC and/or source contact SC and floating gate FGF, to deteriorate data retention characteristics.

Therefore, not only for drain contact DC but also for source contact SC, a distance to floating gate FG is set to be $\lambda m$. Accordingly, an electric field as a cause of leakage to the floating gate can be suppressed, to improve data retention characteristics even when displacement of superposition occurs.

In the foregoing description, charges are accumulated in the floating gate to retain data. The present invention, however, is applicable to a nonvolatile memory which stores data by accumulating charges in an insulating film.

The programmable memory according to the present invention is applicable not only to OTPROM but also to an electrically programmable ROM (with an ultraviolet ray transmission window provided on a package). When the present invention is applied to OTPROM, a highly reliable ROM can be provided with low cost, to be applied to a system on chip (SOC) and the like.

While in the first embodiment, a selection gate voltage and a bit line voltage in programming and reading of the memory cell are negative voltages, these voltages may be positive voltages, and the present invention is applicable also to a memory in a system using only a positive power source without using a negative power source.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A programmable nonvolatile memory, comprising:
a memory cell including a memory cell transistor having first and second impurity regions formed at a surface of a substrate region and a charge accumulation region arranged on the substrate region between the first and second impurity regions for storing data in a nonvolatile manner according to an amount of charges accumulated in said charge accumulation region;
a first conductive line arranged corresponding to said memory cell transistor;
a first contact for electrically connecting the first impurity region with said first conductive line;
a peripheral transistor arranged in a region different from a region for arranging said memory cell on a common semiconductor substrate with said memory cell and used in other function than data storage, said peripheral transistor having third and fourth impurity regions formed at a surface of said semiconductor substrate and a control gate formed above the semiconductor substrate between the third and fourth impurity regions for receiving a signal for setting an on and off state thereof;
a second conductive line arranged corresponding to said peripheral transistor; and
a second contact for electrically connecting the third impurity region with said second conductive line, and
said charge accumulation region being a floating gate formed of a conductive material and a distance between said floating gate and said first contact being set to be greater than a distance between said second contact and said control gate.

2. The programmable nonvolatile memory according to claim 1, wherein the distance between said floating gate and said first contact being set to be at least 1.2 times greater than the distance between said second contact and said control gate.

* * * * *